US010306765B2

(12) United States Patent
Lee et al.

(10) Patent No.: US 10,306,765 B2
(45) Date of Patent: *May 28, 2019

(54) MULTILAYER CERAMIC ELECTRONIC COMPONENT TO BE EMBEDDED IN BOARD AND PRINTED CIRCUIT BOARD HAVING MULTILAYER CERAMIC ELECTRONIC COMPONENT EMBEDDED THEREIN

(71) Applicant: SAMSUNG ELECTRO-MECHANICS CO., LTD., Suwon-si, Gyeonggi-do (KR)

(72) Inventors: Jin Woo Lee, Suwon-si (KR); Jin Man Jung, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/914,664

(22) Filed: Mar. 7, 2018

(65) Prior Publication Data

US 2018/0199440 A1    Jul. 12, 2018

Related U.S. Application Data

(63) Continuation of application No. 15/741,235, filed on Mar. 28, 2017, which is a continuation of application No. 14/135,560, filed on Dec. 19, 2013.

(30) Foreign Application Priority Data

Aug. 30, 2013    (KR) .................. 10-2013-0103714

(51) Int. Cl.
*H01G 4/30* (2006.01)
*H01G 4/005* (2006.01)
(Continued)

(52) U.S. Cl.
CPC .............. *H05K 1/185* (2013.01); *H01G 4/12* (2013.01); *H01G 4/232* (2013.01); *H01G 4/30* (2013.01);
(Continued)

(58) Field of Classification Search
CPC .......... H01G 4/30; H01G 4/228; H01G 4/005; H01G 4/232; H05K 1/185; H05K 1/115
(Continued)

(56) References Cited

U.S. PATENT DOCUMENTS 6,483,692 B2    11/2002 Figueroa et al.
2004/0160751 A1    8/2004 Inagaki et al.
(Continued)

FOREIGN PATENT DOCUMENTS

JP    2001-060530 A    3/2001
JP    2002-280254 A    9/2002
(Continued)

OTHER PUBLICATIONS

Notice of Office Action Japanese Patent Application No. 2013-259213 dated Sep. 8, 2015 with English translation.
(Continued)

*Primary Examiner* — Eric W Thomas
*Assistant Examiner* — Arun Ramaswamy
(74) *Attorney, Agent, or Firm* — Morgan Lewis & Bockius LLP

(57) ABSTRACT

There is provided a multilayer ceramic electronic component embedded in a board including: a ceramic body including dielectric layers; first and second internal electrodes; and first and second external electrodes formed on first and second side surfaces of the ceramic body, respectively, wherein the first external electrode includes a first electrode layer and a first metal layer formed on the first electrode layer, the second external electrode includes a second elec-
(Continued)

trode layer and a second metal layer formed on the second electrode layer, the first and second external electrodes are formed to be extended to first main surface of the ceramic body, and when a maximum width and a minimum width of at least one of the first and second external electrodes formed on the first main surface are defined as BWmax and BWmin, respectively, $0 \leq BWmax-BWmin \leq 100$ µm is satisfied.

7 Claims, 6 Drawing Sheets

(51) Int. Cl.
*H01G 4/232* (2006.01)
*H01G 4/228* (2006.01)
*H05K 1/11* (2006.01)
*H05K 1/18* (2006.01)
*H05K 1/02* (2006.01)
*H01G 4/12* (2006.01)
*H05K 1/09* (2006.01)

(52) U.S. Cl.
CPC ............ *H05K 1/0231* (2013.01); *H05K 1/09* (2013.01); *H05K 1/115* (2013.01); *H05K 2201/10015* (2013.01); *H05K 2201/10636* (2013.01); *Y02P 70/611* (2015.11)

(58) Field of Classification Search
USPC ............ 361/320, 321.2, 321.4, 306.1, 306.2, 361/306.3, 309, 321.3, 301.4, 303, 321.1
See application file for complete search history.

(56) References Cited

U.S. PATENT DOCUMENTS

| | | |
|---|---|---|
| 2006/0126264 A1 | 6/2006 | Yoshii et al. |
| 2007/0000439 A1 | 1/2007 | Yokoyama et al. |
| 2007/0117338 A1 | 5/2007 | Yamamoto et al. |
| 2007/0123413 A1 | 5/2007 | Suzuki |
| 2008/0080121 A1 | 4/2008 | Togashi |
| 2010/0128411 A1 | 5/2010 | Onishi et al. |
| 2012/0018205 A1 | 1/2012 | Sato et al. |
| 2013/0093556 A1 | 4/2013 | Lim |

FOREIGN PATENT DOCUMENTS

| | | |
|---|---|---|
| JP | 2006-173270 A | 6/2006 |
| JP | 2012-028456 A | 2/2012 |
| JP | 2012-253077 A | 12/2012 |
| JP | 2012-256947 A | 12/2012 |
| KR | 10-2009-0083568 A | 8/2009 |
| KR | 10-2013-0039400 A | 4/2013 |

OTHER PUBLICATIONS

Notice of Decision of Rejection Japanese Patent Application No. 2013-259213 dated May 24, 2016 with full translation.
Non-Final Office Action U.S. Appl. No. 14/135,560 dated Jun. 23, 2016.
Final Office Action U.S. Appl. No. 14/135,560 dated Jan. 6, 2017.
Advisory Action U.S. Appl. No. 14/135,560 dated May 18, 2017.
Final Office Action issued in U.S. Appl. No. 15/471,235, dated Aug. 7, 2018 (available via USPTO PAIR System).

X-X'

MULTILAYER CERAMIC ELECTRONIC COMPONENT TO BE EMBEDDED IN BOARD AND PRINTED CIRCUIT BOARD HAVING MULTILAYER CERAMIC ELECTRONIC COMPONENT EMBEDDED THEREIN

CROSS-REFERENCE TO RELATED APPLICATION

This application is a Continuation Application of U.S. Ser. No. 15/471,235 filed Mar. 28, 2017, which is a Continuation Application of U.S. Ser. No. 14/135,560 filed Dec. 19, 2013, which claims the benefit of Korean Patent Application No. 10-2013-0103714 filed on Aug. 30, 2013. The disclosure of each is incorporated herein by reference in entirety.

BACKGROUND

The present disclosure relates to a multilayer ceramic electronic component to be embedded in a board and a printed circuit board having a multilayer ceramic electronic component embedded therein.

As electronic circuits have become highly densified and highly integrated, a mounting space for passive elements mounted on a printed circuit board (PCB) has become insufficient, and in order to solve this defect, ongoing efforts have been made to implement components able to be installed within a board, i.e., embedded devices. In particular, various methods have been proposed for installing a multilayer ceramic electronic component used as a capacitive component within a board.

In one of a variety of methods of installing a multilayer ceramic electronic component within a board, the same dielectric material used for a multilayer ceramic electronic component is used as a material for a board and a copper wiring, or the like, is used as an electrode. Other methods for implementing a multilayer ceramic electronic component to be embedded in a board include a method of forming the multilayer ceramic electronic component to be embedded in the board by forming a polymer sheet having high-k dielectrics and a dielectric thin film within the board, a method of installing a multilayer ceramic electronic component within a board, and the like.

In general, a multilayer ceramic electronic component includes a plurality of dielectric layers formed of a ceramic material, and internal electrodes interposed between the dielectric layers. By disposing such a multilayer ceramic electronic component within a board, a multilayer ceramic electronic component to be embedded in a board having high capacitance may be implemented.

In order to manufacture a printed circuit board (PCB) including a multilayer ceramic electronic component embedded therein, a multilayer ceramic electronic component may be inserted into a core board, and via holes are required to be formed in an upper laminated plate and a lower laminated plate by using a laser in order to connect board wirings and external electrodes of the multilayer ceramic electronic component. Laser beam machining, however, considerably increases manufacturing costs of a PCB.

In a process of embedding the multilayer ceramic electronic component in the board, a heat treatment process for curing an epoxy resin and crystallizing a metal electrode is performed. In this case, a difference in coefficients of thermal expansion (CTE) between the epoxy resin, the metal electrode, a ceramic of the multilayer ceramic electronic component, and the like, or a defect in an adhesion surface between the board and the multilayer ceramic electronic component due to thermal expansion of the board may occur. This defect causes delamination of the adhesion surface in a reliability test process.

Meanwhile, in the case in which a multilayer ceramic capacitor is used as a decoupling capacitor of an application processor of a smart phone or a high performance integrated circuit (IC) power supply terminal of a personal computer (PC), such as a central processing unit (CPU), when an equivalent series inductance (hereinafter, referred to as an "ESL") increases, performance of an IC may be deteriorated. As performance of the application processor of the smart phone or the CPU of the PC is gradually improved, an influence of the increase in the ESL of the multilayer ceramic capacitor on the deterioration of the performance of the IC relatively increases.

A "low inductance chip capacitor (LICC)" is intended to decrease a distance between the capacitor and an external terminal to decrease a path of a current flow, thereby decreasing an inductance of a capacitor.

Also in the case of the multilayer ceramic electronic component to be embedded in a board, the "LICC" needs to be applied in order to decrease the inductance as described above.

However, in the "LICC", it is difficult to implement bandwidths of external electrodes in the same level as those of a general multilayer ceramic electronic component to be embedded in a board.

Therefore, in the case of applying the "LICC" to the multilayer ceramic electronic component to be embedded in a board, a processing area of vias for electrical connection with a package substrate circuit decreases, such that it is difficult to embed the "LICC" in the board.

In addition, external electrodes of the multilayer ceramic electronic component to be embedded in a board are generally formed by applying conductive pastes for the external electrode to both end portions of a ceramic body.

In this case, due to bleeding of the conductive pastes for the external electrode applied to upper and lower surfaces of the ceramic body, a deviation between bandwidths of the external electrodes occurs, such that a defect may frequently occur at the time of processing the vias.

In addition, in the case in which the deviation between bandwidths of the external electrodes occurs as described above, connection between a plurality of vias is impossible, such that it is difficult to decrease a current path in order to decrease an ESL.

RELATED ART DOCUMENT (Patent Document 1) Korean Patent Laid-Open Publication No. 2009-0083568

SUMMARY

An aspect of the present disclosure may provide a multilayer ceramic electronic component to be embedded in a board and a printed circuit board having a multilayer ceramic electronic component embedded therein.

According to an aspect of the present disclosure, a multilayer ceramic electronic component to be embedded in a board may include: a ceramic body including dielectric layers, having first and second main surfaces facing each other, first and second side surfaces facing each other, and first and second end surfaces facing each other, and having a thickness of 100 μm or less; first and second internal electrodes disposed to face each other, having the dielectric layers interposed therebetween, and alternately exposed to the first side surface or the second side surface; and first and second external electrodes formed on the first and second side surfaces of the ceramic body, respectively, and electrically connected to the first and second internal electrodes, respectively, wherein the first external electrode includes a first electrode layer and a first metal layer formed on the first electrode layer, the second external electrode includes a second electrode layer and a second metal layer formed on the second electrode layer, the first and second external electrodes are formed to be extended to the first main surface of the ceramic body, and when a maximum width and a minimum width of at least one of the first and second external electrodes formed on the first main surface are defined as BWmax and BWmin, respectively, $0 \leq BWmax-BWmin \leq 100$ μm is satisfied.

Widths of the first and second external electrodes formed on the first main surface may be larger than those of the first and second external electrodes formed on the second main surface.

When a thickness of the ceramic body is a distance between the first and second main surfaces, a width of the ceramic body is a distance between the first side surface on which the first external electrode is formed and the second side surface on which the second external electrode is formed, and a length of the ceramic body is a distance between the first and second end surfaces, the width of the ceramic body may be shorter than or equal to the length of the ceramic body.

When the length and the width of the ceramic body are defined as L and W, respectively, $0.5L \leq W \leq L$ may be satisfied.

When a thickness of each of the first and second metal layers is defined as tp, $tp \geq 5$ μm may be satisfied.

When surface roughness of each of the first and second metal layers is defined as Ra and a thickness of each of the first and second metal layers is defined as tp, $200 \text{ nm} \leq Ra \leq tp$ may be satisfied.

The first and second metal layers may include copper (Cu).

According to another aspect of the present disclosure, a printed circuit board having a multilayer ceramic electronic component embedded therein may include: an insulating substrate; and the multilayer ceramic electronic component embedded in the insulating substrate and including a ceramic body including dielectric layers, having first and second main surfaces facing each other, first and second side surfaces facing each other, and first and second end surfaces facing each other, and having a thickness of 100 μm or less, first and second internal electrodes disposed to face each other, having the dielectric layers interposed therebetween, and alternately exposed to the first side surface or the second side surface, and first and second external electrodes formed on the first and second side surfaces of the ceramic body, respectively, and electrically connected to the first and second internal electrodes, respectively, wherein the first external electrode includes a first electrode layer and a first metal layer formed on the first electrode layer, the second external electrode includes a second electrode layer and a second metal layer formed on the second electrode layer, the first and second external electrodes are formed to be extended to the first main surface of the ceramic body, and when a maximum width and a minimum width of at least one of the first and second external electrodes formed on the first main surface are defined as BWmax and BWmin, respectively, $0 \leq BWmax-BWmin \leq 100$ μm is satisfied.

Widths of the first and second external electrodes formed on the first main surface may be larger than those of the first and second external electrodes formed on the second main surface.

The insulating substrate may include a plurality of conductive patterns and a plurality of conductive via holes.

Each of the first and second external electrodes may be connected to three or more conductive via holes.

When a thickness of the ceramic body is a distance between the first and second main surfaces, a width of the ceramic body is a distance between the first side surface on which the first external electrode is formed and the second side surface on which the second external electrode is formed, and a length of the ceramic body is a distance between the first and second end surfaces, the width of the ceramic body may be shorter than or equal to the length of the ceramic body.

When the length and the width of the ceramic body are defined as L and W, respectively, $0.5L \leq W \leq L$ may be satisfied.

When a thickness of each of the first and second metal layer is defined as tp, $tp \geq 5$ μm may be satisfied.

When surface roughness of each of the first and second metal layers is defined as Ra and a thickness of each of the first and second metal layers is defined as tp, $200 \text{ nm} \leq Ra \leq tp$ may be satisfied.

The first and second metal layers may include copper (Cu).

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
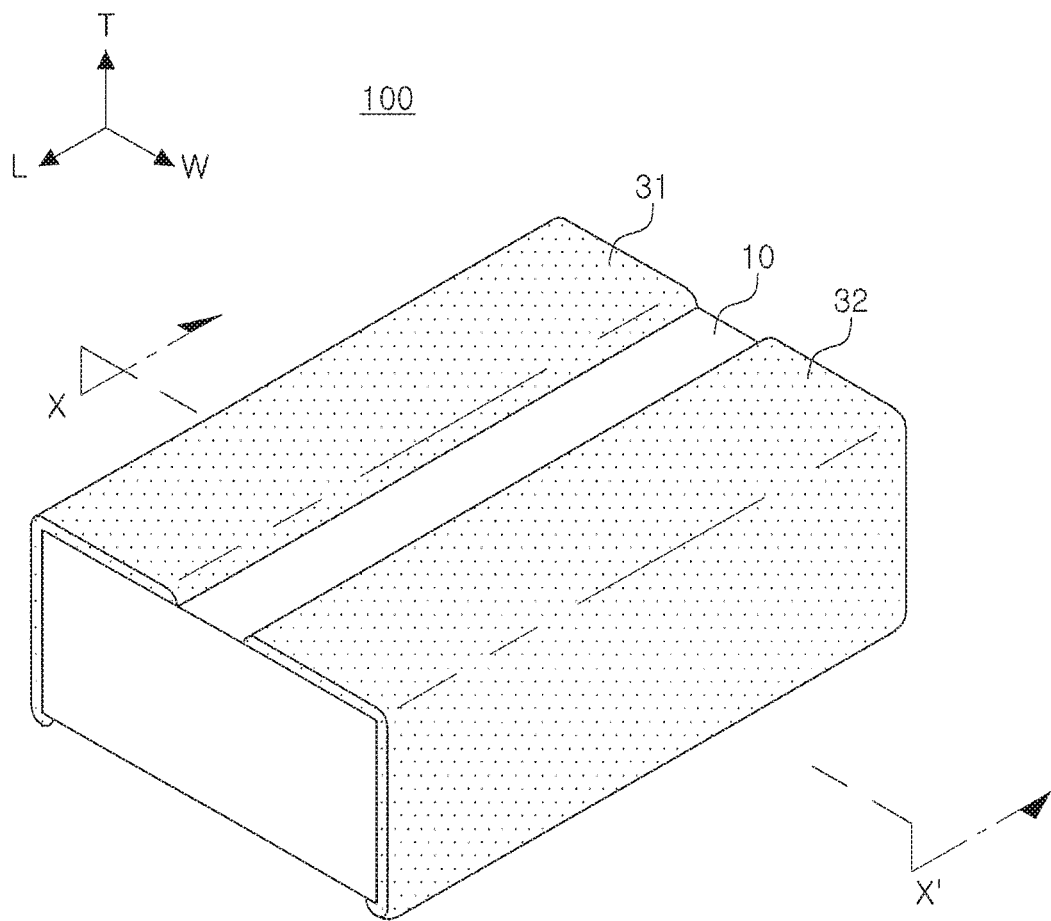
FIG. 1 is a perspective view of a multilayer ceramic electronic component to be embedded in a board according to an exemplary embodiment of the present disclosure.

Hereinafter, exemplary embodiments of the present disclosure will be described in detail with reference to the accompanying drawings.

The disclosure may, however, be embodied in many different forms and should not be construed as being limited to the embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a perspective view of a multilayer ceramic electronic component to be embedded in a board according to an exemplary embodiment of the present disclosure.

Figure 2:
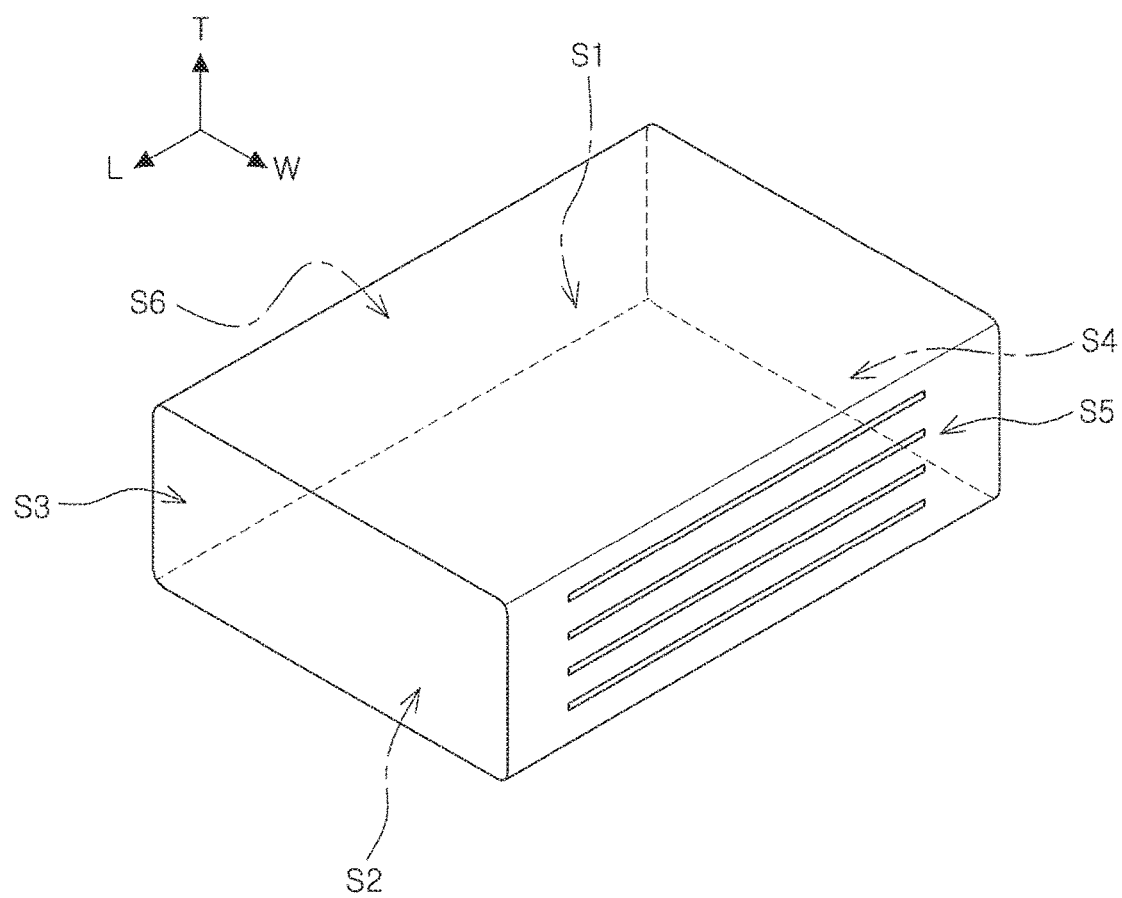
FIG. 2 is a view showing a ceramic body according to the exemplary embodiment of the present disclosure.

FIG. 2 is a view showing a ceramic body according to the exemplary embodiment of the present disclosure.

Figure 3:
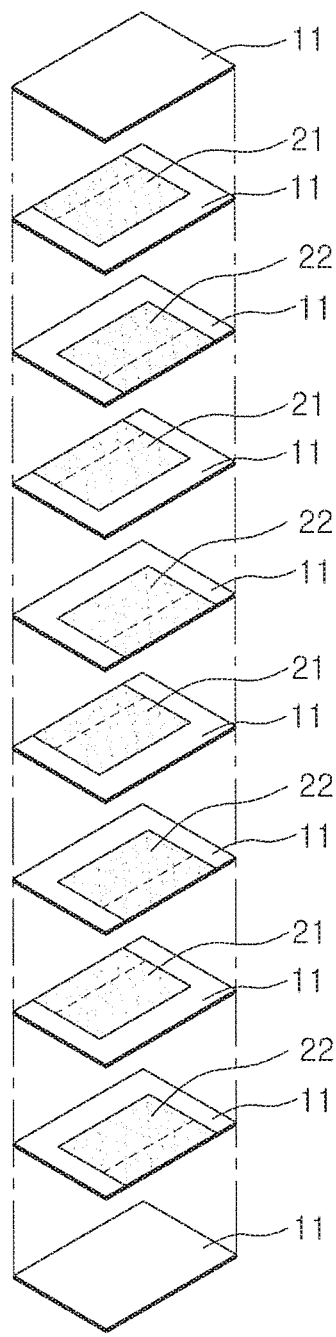
FIG. 3 is an exploded perspective view of FIG. 2.

FIG. 3 is an exploded perspective view of FIG. 2.

Figure 4:
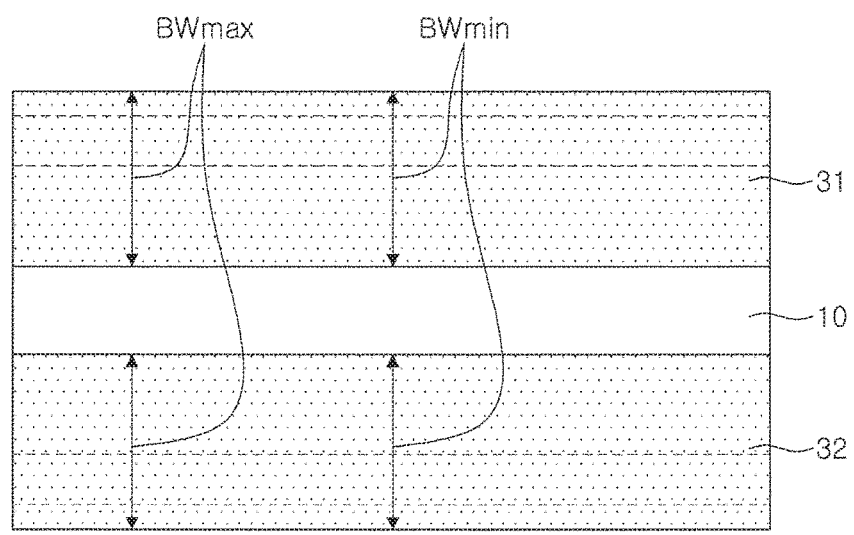
FIG. 4 is a top plan view of FIG. 1.

FIG. 4 is a top plan view of FIG. 1.

Figure 5:
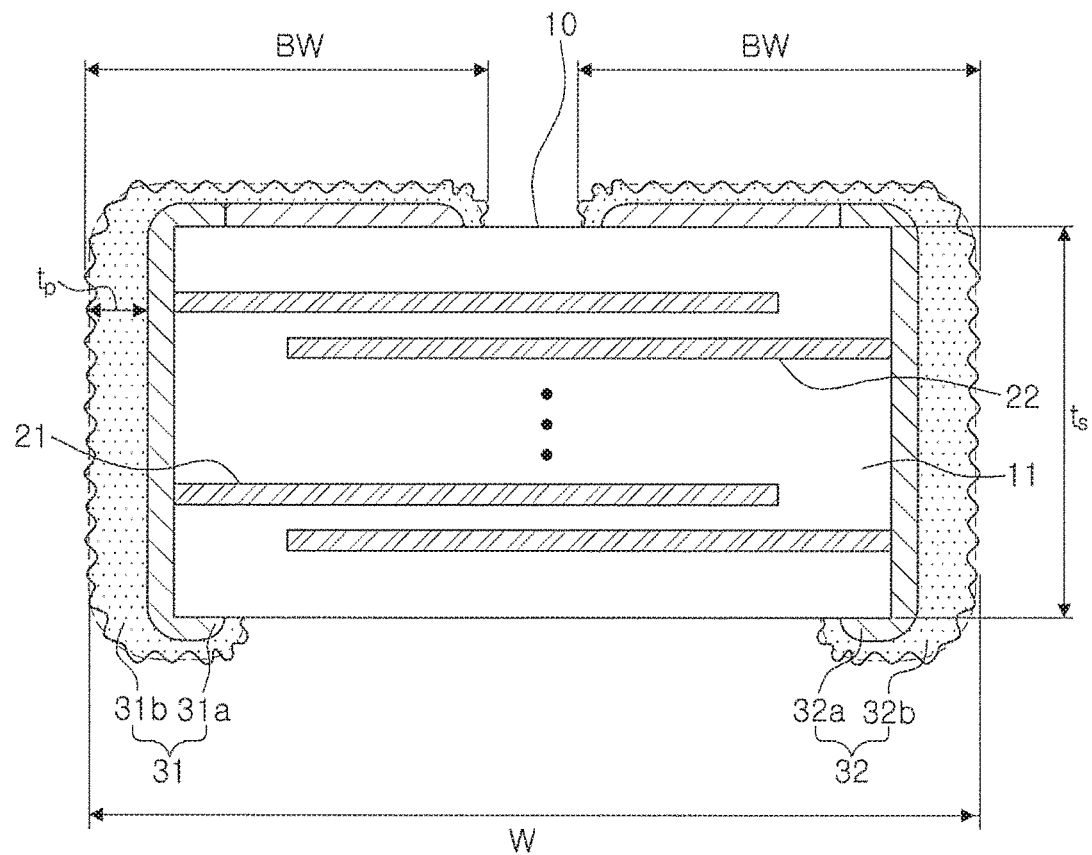
FIG. 5 is a cross-sectional view taken along line X-X' of FIG. 1.

FIG. 5 is a cross-sectional view taken along line X-X' of FIG. 1.

Referring to FIGS. 1 through 5, a multilayer ceramic electronic component 100 to be embedded in a board according to the exemplary embodiment of the present disclosure may include a ceramic body 10 including dielectric layers 11, having first and second main surfaces S1 and S2 facing each other, first and second side surfaces S5 and S6 facing each other, and first and second end surfaces S3 and S4 facing each other, and having a thickness of 100 µm or less; first and second internal electrodes 21 and 22 disposed to face each other, having the dielectric layers 11 interposed therebetween, and alternately exposed to the first side surface S5 or the second side surface S6; and first and second external electrodes 31 and 32 formed on the first and second side surfaces S5 and S6 of the ceramic body 10, respectively, and electrically connected to the first and second internal electrodes 21 and 22, respectively, wherein the first external electrode 31 includes a first electrode layer 31a and a first metal layer 32a formed on the first electrode layer 31a, the second external electrode 32 includes a second electrode layer 32a and a second metal layer 32b formed on the second electrode layer 32a, the first and second external electrodes 31 and 32 are formed to be extended to the first main surface S1 of the ceramic body 10, and when a maximum width and a minimum width of at least one of the first and second external electrodes 31 and 32 formed on the first main surface S1 are defined as BWmax and BWmin, respectively, $0 \leq BWmax - BWmin \leq 100$ µm may be satisfied.

Hereinafter, the multilayer ceramic electronic component according to the embodiment of the present invention will be described by taking a multilayer ceramic capacitor by way of example. However, the present disclosure is not limited thereto.

In the multilayer ceramic capacitor according to the exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' refers to a direction in which the dielectric layers are stacked, that is, a 'stacking direction'.

According to the exemplary embodiment of the present disclosure, the ceramic body 10 may have the first and second main surfaces S1 and S2 facing each other, and the first and second side surfaces S5 and S6 and the first and second end surfaces S3 and S4 that connect the first and second main surfaces to each other. A shape of the ceramic body 10 is not particularly limited, but may be a hexahedral shape as shown.

According to the exemplary embodiment of the present disclosure, a raw material forming the dielectric layer 11 is not particularly limited as long as a sufficient capacitance may be obtained. For example, the raw material forming the dielectric layer 11 may be a barium titanate ($BaTiO_3$) powder.

A material forming the dielectric layer 11 may be prepared by adding various ceramic additives, organic solvents, plasticizers, binders, dispersing agents, and the like, to a powder such as the barium titanate ($BaTiO_3$) powder, or the like, according to an object of the present disclosure.

An average particle size of the ceramic powder used to form the dielectric layer 11 is not particularly limited, but may be controlled in order to accomplish an object of the present disclosure. For example, the average particle size may be controlled to be 400 nm or less.

A material forming the first and second internal electrodes 21 and 22 is not particularly limited, but may be a conductive paste formed of at least one selected from a group consisting of, for example, a noble metal material such as palladium (Pd), a palladium-silver (Pd—Ag) alloy, or the like, nickel (Ni), and copper (Cu).

The first and second internal electrodes 21 and 22 may be disposed to face each other, having the dielectric layers 11 interposed therebetween, and be alternately exposed to the first side surface S5 or the second side surface S6.

The first and second internal electrodes 21 and 22 are alternately exposed to the first side surface S5 or the second side surface S6, whereby a reverse geometry capacitor (RGC) or a low inductance chip capacitor (LICC) may be implemented as described below.

The ceramic body 10 may have a thickness ts of 100 µm or less.

As described above, the ceramic body 10 is manufactured to have the thickness ts of 100 µm or less, such that it may be appropriate for a multilayer ceramic capacitor to be embedded in a board.

In addition, the thickness ts of the ceramic body 10 may be a distance between the first and second main surfaces S1 and S2.

According to the exemplary embodiment of the present disclosure, the ceramic body 10 may have the first and second external electrodes 31 and 32 formed on outer portions thereof, wherein the first and second external electrodes 31 and 32 may include the first and second electrode layers 31a and 32a and the first and second metal layers 31b and 32b formed on the first and second electrode layers, respectively.

In order to form capacitance, the first and second electrode layers 31a and 32a may be formed on the outer portions of the ceramic body 10 and be electrically connected to the first and second internal electrodes 21 and 22, respectively.

The first and second electrode layers 31a and 32a may be formed of the same conductive material as that of the first and second internal electrodes 21 and 22, but is not limited thereto. For example, the first and second electrode layers 31a and 32a may be formed of copper (Cu), silver (Ag), nickel (Ni), or the like.

The first and second electrode layers 31a and 32a may be formed by applying a conductive paste prepared by adding a glass frit to the metal powder to the outer portions and then firing the conductive paste.

A general multilayer ceramic capacitor may have a length longer than a width and include external electrodes disposed on end surfaces facing each other in the length direction of the ceramic body.

In this case, since a current path is long at the time of applying an alternating current (AC) current to the external electrode, a large current loop may be formed, and a magnitude of an induced magnetic field is increased, such that inductance may be increased.

In the multilayer ceramic capacitor according to the exemplary embodiment of the present disclosure, the first and second external electrodes 31 and 32 may be formed on the first and second side surfaces S5 and S6 of the ceramic body 10, respectively, in order to decrease the current path.

A width W of the ceramic body 10 may be a distance between the first side surface S5 on which the first external electrode 31 is formed and the second side surface S6 on which the second external electrode 32 is formed, and a length L of the ceramic body 10 may be a distance between the first and second end surfaces S3 and S4.

According to the exemplary embodiment of the present disclosure, the width W of the ceramic body 10, that is, the distance between the first and second side surfaces S5 and S6 on which the first and second external electrodes 31 and 32 are formed, respectively, may be shorter than or equal to the length L of the ceramic body 10, that is, the distance between the first and second end surfaces S3 and S4.

Therefore, since a distance between the first and second external electrodes 31 and 32 is decreased, a current path may be decreased. As a result, a current loop may be decreased to decrease inductance.

The multilayer ceramic electrode component as described above in which the first and second external electrodes 31 and 32 are formed on the first and second side surfaces S5 and S6 of the ceramic body 10, respectively, such that the width W of the ceramic body 10 (that is, the distance between the first and second side surfaces S5 and S6) is shorter than or equal to the length L of the ceramic body 10 may be called a reverse geometry capacitor (RGC) or a low inductance chip capacitor (LICC).

In addition, when the length and the width of the ceramic body 10 are defined as L and W, respectively, $0.5L \leq W \leq L$ may be satisfied. However, the present disclosure is not limited thereto.

The length and the width of the ceramic body may be adjusted to satisfy $0.5L \leq W \leq L$, whereby the inductance of the multilayer ceramic capacitor may be decreased.

Therefore, the multilayer ceramic electronic component according to the exemplary embodiment of the present disclosure may implement a low inductance, such that electrical performance thereof may be improved.

According to the exemplary embodiment of the present disclosure, the first and second metal layers 31b and 32b including copper (Cu) may be formed on the first and second electrode layers 31a and 32a, respectively.

Generally, since the multilayer ceramic capacitor is mounted on a printed circuit board, a nickel/tin plated layer may be usually formed on the external electrode.

However, the multilayer ceramic capacitor according to the exemplary embodiment of the present disclosure may be embedded in a printed circuit board, rather than being mounted on the board, and the first and second external electrodes 31 and 32 of the multilayer ceramic capacitor and a circuit of the board may be electrically connected to each other by vias formed in the board and made of a copper (Cu) material.

Therefore, according to the exemplary embodiment of the present disclosure, the first and second metal layers 31b and 32b may include copper (Cu) having good electrical connectivity with the copper (Cu), which is a material of the via formed in the board.

A method of forming the first and second metal layers 31b and 32b including the copper (Cu) is not particularly limited. For example, the first and second metal layers 31b and 32b may be formed by plating. In this case, the first and second metal layers 31b and 32b may be formed of a plated layer including the copper (Cu).

Referring to FIGS. 4 and 5, the first and second external electrodes 31 and 32 may be formed to be extended to the first main surface S1 of the ceramic body 10, and when a maximum width and a minimum width of at least one of the first and second external electrodes 31 and 32 formed on the first main surface S1 are defined as BWmax and BWmin, respectively, $0 \leq BWmax - BWmin \leq 100$ μm may be satisfied.

In the case in which a general multilayer ceramic capacitor is used as a decoupling capacitor of an application processor of a smart phone or a high performance integrated circuit (IC) power supply terminal of a personal computer (PC), such as a central processing unit (CPU), an equivalent series inductance (hereinafter, referred to as an "ESL") increases, such that performance of an IC may be deteriorated.

Particularly, as performance of the application processor of the smart phone or the CPU of the PC has gradually been improved, an influence of the increase in the ESL of the multilayer ceramic capacitor on the deterioration of the performance of the IC may be relatively increased.

In order to solve the above-mentioned defects, also in the case of the multilayer ceramic electronic component to be embedded in a board, the low inductance chip capacitor (LICC) needs to be applied in order to decrease the inductance as described above.

However, in the low inductance chip capacitor (LICC), it may be difficult to implement bandwidths of external electrodes in the same level as those of a general multilayer ceramic electronic component to be embedded in a board.

Therefore, in the case of applying the low inductance chip capacitor (LICC) to the multilayer ceramic electronic component to be embedded in a board, a processing area of vias for electrical connection with a package substrate circuit is decreased, such that it may be difficult to embed the low inductance chip capacitor (LICC) in the board.

In addition, external electrodes of the multilayer ceramic electronic component to be embedded in a board may be generally formed by applying a conductive paste for the external electrode to both end portions of a ceramic body.

In this case, due to the bleeding of the conductive paste for the external electrode applied onto upper and lower surfaces of the ceramic body, a deviation between the bandwidths of the external electrodes occurs, such that a defect may frequently occur at the time of processing the vias.

In addition, in the case in which the deviation between bandwidths of the external electrodes occurs as described above, connection between a plurality of vias is impossible, such that it is difficult to decrease a current path in order to decrease an ESL.

According to the exemplary embodiment of the present disclosure, the first and second external electrodes 31 and 32 are extended to the first main surface S1 of the ceramic body 10 and are formed such that $0 \leq BWmax - BWmin \leq 100$ μm is satisfied when the maximum width and the minimum width of at least one of the first and second external electrodes 31 and 32 formed on the first main surface S1 are defined as BWmax and BWmin, respectively, whereby the above-mentioned defects may be solved.

Particularly, the first and second external electrodes 31 and 32 are formed such that the maximum widths (BWmax) and the minimum widths (BWmin) of both first and second external electrodes 31 and 32 formed on the first main surface S1 satisfy $0 \leq BWmax - BWmin \leq 100$ μm, whereby the above-mentioned defects may be more effectively solved.

That is, in the case of using the multilayer ceramic electronic component to be embedded in a board according to the exemplary embodiment of the present disclosure, a defect occurring at the time of processing vias for electrical connection with a package substrate circuit may be prevented.

In addition, the first and second external electrodes 31 and 32 are formed such that the maximum width (BWmax) and the minimum width (BWmin) of at least one of the first and second external electrodes 31 and 32 formed on the first main surface S1 satisfy 0≤BWmax−BWmin≤100 μm, such that a deviation between the bandwidths of the external electrodes is decreased, whereby a plurality of vias may be connected to each other. Therefore, a current path may be decreased in order to decrease an ESL.

In the case in which a difference (BWmax−BWmin) between the maximum width (BWmax) and the minimum width (BWmin) of at least one of the first and second external electrodes 31 and 32 formed on the first main surface S1 exceeds 100 μm, a defect may occur at the time of processing vias for electrical connection with a package substrate circuit.

As described above, since external electrodes of a general multilayer ceramic electronic component to be embedded in a board are formed by applying a conductive paste to both end portions of the ceramic body, a difference between a maximum width and a minimum width of each of the external electrodes may frequently exceed 100 μm.

According to the exemplary embodiment of the present disclosure, the external electrodes may be formed in such a manner that the difference (BWmax−BWmin) between the maximum width (BWmax) and the minimum width (BWmin) of at least one of the first and second external electrodes 31 and 32 formed on the first main surface S1 is 100 μm or less.

The first and second external electrodes 31 and 32 may be formed on the first main surface S1 by the following processes. First, a conductive paste for the external electrode may be applied to the first main surface S1 by a printing method.

In the case of applying the conductive paste for the external electrode onto the first main surface S1 by the printing method as described above, a deviation between the bandwidths due to the bleeding of the conductive paste may be decreased.

Specifically, after a low inductance chip capacitor (LICC) of which a ceramic body has a thickness of 100 μm or less is loaded on a jig, printing may be performed in the state in which a plate is disposed on an upper surface of the LICC.

After this process, secondarily, both end surfaces of the ceramic body may be dipped in the conductive paste for the external electrode so that the external electrodes formed on both end surfaces of the ceramic body have required thicknesses, thereby forming the external electrodes.

As described above, the external electrode of the multilayer ceramic electronic component to be embedded in a board according to the exemplary embodiment of the present disclosure may be formed by primarily applying the conductive paste for the external electrode onto the first main surface of the ceramic body by the printing method in order to form a bandwidth and secondarily applying the conductive paste for the external electrode onto both end surfaces of the ceramic body by a dipping method.

In this case, widths of the first and second external electrodes 31 and 32 formed on the first main surface S1 may be greater than those of the first and second external electrodes 31 and 32 formed on the second main surface S2.

The first and second external electrodes 31 and 32 are formed as described above, such that a deviation between a maximum width and a minimum width of the external electrode formed on the first main surface may be decreased as small as possible, whereby a defect occurring at the time of processing vias for electrical connection with a package substrate circuit may be prevented.

In addition, a deviation between bandwidths of each of the first and second external electrodes 31 and 32 may be decreased, such that connection between a plurality of vias is possible. Therefore, a current path may be decreased in order to decrease an ESL.

Meanwhile, according to the exemplary embodiment of the present disclosure, the ceramic body 10 may include an active layer including the first and second internal electrodes 21 and 22 and a cover layer formed on an upper surface or a lower surface of the active layer.

The ceramic body 10 may include the active layer including the first and second internal electrodes 21 and 22, wherein the active layer may contribute to the formation of capacitance.

In addition, the ceramic body 10 may include the cover layer formed on the upper surface or the lower surface of the active layer.

In addition, when a thickness of each of the first and second metal layers 31b and 32b is defined as tp, tp≥5 μm may be satisfied.

The thickness tp of each of the first and second metal layers 31b and 32b may satisfy tp≥5 μm, but is not limited thereto. That is, the thickness tp of each of the first and second metal layers 31b and 32b may be 15 μm or less.

As described above, the thickness tp of each of the first and second metal layers 31b and 32b may be adjusted to satisfy tp≥5 μm but within a range of 15 μm or less, whereby a multilayer ceramic capacitor allowing for excellent processing of the vias in the board and having excellent reliability may be implemented.

In the case in which the thickness tp of each of the first and second metal layers 31b and 32b is less than 5 μm, when the multilayer ceramic electronic component 100 is embedded in a printed circuit board, a defect that a conductive via hole 140 is connected to the ceramic body 10 may occur at the time of processing a conductive via hole 140.

In the case in which the thickness tp of each of the first and second metal layers 31b and 32b exceeds 15 μm, a crack may occur in the ceramic body 10 due to stress of the metal layers 31b and 32b.

Meanwhile, when surface roughness of each of the first and second metal layers 31b and 32b is defined as Ra and the thickness of each of the first and second metal layers 31b and 32b is defined as tp, 200 nm≤Ra≤tp may be satisfied.

The surface roughness (Ra) of each of the first and second metal layers 31b and 32b may be adjusted to satisfy 200 nm≤Ra≤tp, whereby a delamination phenomenon between the multilayer ceramic electronic component and the board may be decreased and a crack may be prevented.

The surface roughness indicates a degree of fine prominence-depression generated on a metal surface when the metal surface is processed.

Surface roughness refers to a degree of fine depressions and protrusions formed on a metal surface when the metal surface is processed.

Surface roughness is generated due to a tool used for processing, whether or not a processing method is appropriate, grooves formed as a surface is scratched, rust, or the like. In determining a degree of roughness, a surface is cut in a direction perpendicular thereto and a cross-section thereof having a certain curvature is checked. A height from the lowest point to the highest point of the curved line is taken and determined as a center line average roughness denoted by Ra.

In the exemplary embodiment of the present disclosure, a center line average roughness of each of the first and second metal layers 31b and 32b will be defined as Ra.

Referring to FIG. 5, in the multilayer ceramic electronic component according to the exemplary embodiment of the present disclosure, when the surface roughness of each of the first and second metal layers 31b and 32b is defined as Ra and the thickness of each of the first and second metal layers 31b and 32b is defined as tp, 200 nm≤Ra≤tp may be satisfied.

More specifically, a method of calculating the center line average roughness Ra of each of the first and second metal layers 31b and 32b will be described. First, a virtual center line may be drawn with respect to roughness formed on one surfaces of the first and second metal layers 31b and 32b.

Next, the respective distances (for example, $r_1, r_2, r_3 \ldots r_{13}$) may be measured based on the virtual center line of the roughness, an average value of the respective distances may be calculated and represented by the following Equation, and the center line average roughness Ra of the first and second metal layers 31b and 32b may be calculated using the calculated average value.

$$R_a = \frac{|r_1| + |r_2| + |r_3| + \cdots |r_n|}{n}$$

The center line average roughness Ra of each of the first and second metal layers 31b and 32b may be adjusted in the range of 200 nm≤Ra≤tp, whereby a multilayer ceramic electronic component having excellent withstand voltage characteristics, improved adhesion with the board, and excellent reliability may be implemented.

In the case in which the surface roughness of each of the first and second metal layers 31b and 32b is less than 200 nm, a delamination phenomenon between the multilayer ceramic electronic component and the board may occur.

Meanwhile, in the case in which the surface roughness of each of the first and second metal layers 31b and 32b exceeds the thickness tp of each of the first and second metal layers 31b and 32b, a crack may occur.

The thickness of the first and second metal layers 31b and 32b may mean an average thickness thereof.

The average thickness of the first and second metal layers 31b and 32b may be measured from an image obtained by scanning a cross-section of the ceramic body 10 in the length direction using a scanning electronic microscope (SEM), as shown in FIG. 4.

For example, as shown in FIG. 5, the thicknesses of the first and second metal layers 31b and 32b may be measured from an image obtained by scanning a cross-section in a length and thickness (L-T) direction taken along a central portion of the ceramic body 10 in the width (W) direction using the scanning electronic microscope (SEM).

Hereinafter, a method of manufacturing a multilayer ceramic electronic component to be embedded in a board according to an exemplary embodiment of the present disclosure will be described. However, the present disclosure is not limited thereto.

In the method of manufacturing a multilayer ceramic electronic component to be embedded in a board according to the exemplary embodiment of the present disclosure, a plurality of ceramic green sheets may first be prepared by applying a slurry including a barium titanate ($BaTiO_3$) powder and the like to carrier films and drying the same, thereby forming dielectric layers.

The slurry may be prepared by mixing a ceramic powder, a binder, and a solvent, and the slurry may be used to form the ceramic green sheets each having a thickness of several μm by a doctor blade method.

Next, a conductive paste for internal electrodes, including 40 to 50 parts by weight of a nickel powder having a nickel particle average size of 0.1 to 0.2 μm may be prepared.

After the conductive paste for internal electrodes is applied to the ceramic green sheets by a screen printing method to form internal electrodes, 400 to 500 ceramic green sheets are stacked to form an active layer, and the ceramic green sheets are stacked on an upper surface or a lower surface of the active layer to form a cover layer, thereby manufacturing a ceramic body 10 having first and second main surfaces facing each other, first and second side surfaces facing each other, and first and second end surfaces facing each other.

Then, first and second electrode layers may be formed on the first and second side surfaces of the ceramic body, respectively. Next, first and second metal layers including copper (Cu) may be formed on first and second external electrodes, respectively.

The forming of the first and second metal layers including the copper (Cu) is not particularly limited, but may be performed by, for example, plating.

According to the exemplary embodiment of the present disclosure, as described above, the external electrodes may be formed in such a manner the difference (BWmax−BWmin) between the maximum width BWmax and the minimum width BWmin of at least one of the first and second external electrodes 31 and 32 formed on the first main surface S1 is 100 μm or less.

The first and second external electrodes 31 and 32 may be formed on the first main surface S1 by the following processes. Primarily, conductive pastes for the external electrode may be applied onto the first main surface S1 by a printing method.

In the case of applying the conductive pastes for the external electrode onto the first main surface S1 by the printing method as described above, a deviation between the bandwidths due to bleeding of the conductive pastes may be decreased.

More specifically, after a low inductance chip capacitor (LICC) of which a ceramic body has a thickness of 100 μm or less is loaded on a jig, printing may be performed in the state in which a plate is disposed on an upper surface of the LICC.

After this process, secondarily, both end surfaces of the ceramic body may be dipped in the conductive paste for the external electrode so that the external electrodes formed on both end surfaces of the ceramic body have required thicknesses, thereby forming the external electrodes.

As described above, the external electrode of the multilayer ceramic electronic component to be embedded in a board according to the exemplary embodiment of the present disclosure may be formed by primarily applying the conductive pastes for the external electrode onto the first main surface of the ceramic body by the printing method in order to form a bandwidth and secondarily applying the conductive pastes for the external electrode onto both end surfaces of the ceramic body by a dipping method.

A description of portions having the same features as those of the multilayer ceramic electronic component to be embedded in a board according to the exemplary embodiment of the present disclosure will be omitted.

Figure 6:
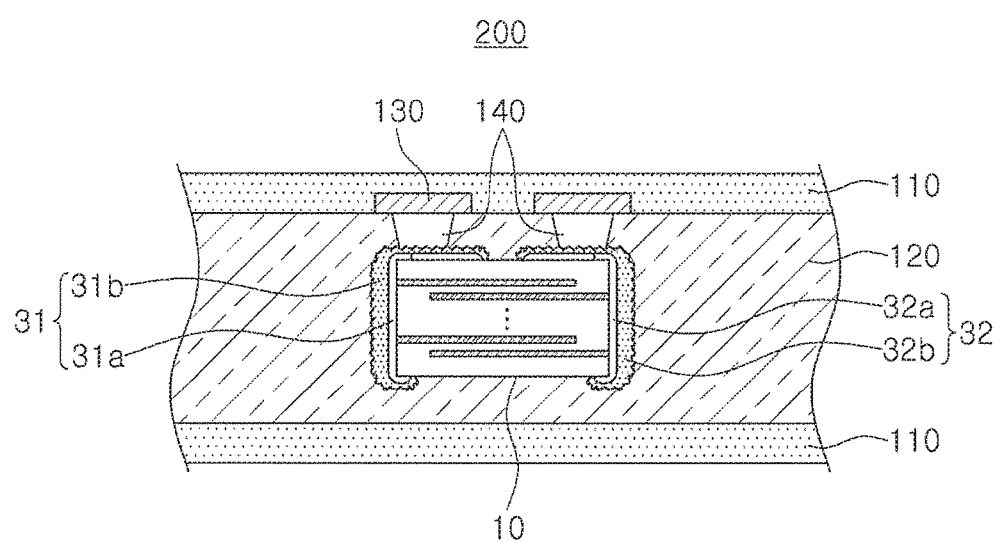
FIG. 6 is a cross-sectional view showing a printed circuit board having a multilayer ceramic electronic component embedded therein according to an exemplary embodiment of the present disclosure.

FIG. 6 is a cross-sectional view showing a printed circuit board 200 having a multilayer ceramic electronic component embedded therein according to an exemplary embodiment of the present disclosure.

Since multilayer ceramic electronic component shown in FIG. 6 is substantially the same as the multilayer ceramic electronic component 100 described above with reference to FIGS. 1 through 5, components that are the same as or similar to those of the multilayer ceramic electronic component 100 described above with reference to FIGS. 1 through 5 will be denoted by the same reference numerals, and an overlapped description will be omitted.

Referring to FIG. 6, the printed circuit board 200 having a multilayer ceramic electronic component embedded therein according to another exemplary embodiment of the present disclosure may include an insulating substrate 110; and the multilayer ceramic electronic component 100 embedded in the insulating substrate 110 and including the ceramic body 10 including the dielectric layers 11, having the first and second main surfaces S1 and S2 facing each other, the first and second side surfaces S5 and S6 facing each other, and the first and second end surfaces S3 and S4 facing each other, and having a thickness of 100 μm or less, the first and second internal electrodes 21 and 22 disposed to face each other, having the dielectric layers 11 interposed therebetween, and alternately exposed to the first side surface S5 or the second side surface S6, and the first and second external electrodes 31 and 32 formed on the first and second side surfaces S5 and S6 of the ceramic body 10, respectively, and electrically connected to the first and second internal electrodes 21 and 22, respectively, wherein the first external electrode 31 includes the first electrode layer 31a and the first metal layer 32a formed on the first electrode layer 31a, the second external electrode 32 includes the second electrode layer 32a and the second metal layer 32b formed on the second electrode layer 32a, the first and second external electrodes 31 and 32 are formed to be extended to the first main surface S1 of the ceramic body 10, and when a maximum width and a minimum width of at least one of the first and second external electrodes 31 and 32 formed on the first main surface S1 are defined as BWmax and BWmin, respectively, 0≤BWmax−BWmin≤100 μm is satisfied.

Widths of the first and second external electrodes formed on the first main surface may be larger than those of the first and second external electrodes formed on the second main surface.

In the multilayer ceramic capacitor 100 included in the printed circuit board 200 according to the exemplary embodiment of the present disclosure, the first and second external electrodes 31 and 32 may be formed on the first and second side surfaces S5 and S6 of the ceramic body 10 in order to decrease a current path.

A width W of the ceramic body 10 may be a distance between the first side surface S5 on which the first external electrode 31 is formed and the second side surface S6 on which the second external electrode 32 is formed, and a length L of the ceramic body 10 may be a distance between the first and second end surfaces S3 and S4.

According to another exemplary embodiment of the present disclosure, the width W of the ceramic body 10, that is, the distance between the first and second side surfaces S5 and S6 on which the first and second external electrodes 31 and 32 are formed, respectively, may be shorter than or equal to the length L of the ceramic body 10, that is, the distance between the first and second end surfaces S3 and S4.

Therefore, since a distance between the first and second external electrodes 31 and 32 is decreased, a current path may be decreased. As a result, a current loop may be decreased to decrease inductance.

The multilayer ceramic electrode component as described above in which the first and second external electrodes 31 and 32 are formed on the first and second side surfaces S5 and S6 of the ceramic body 10, respectively, such that the width W of the ceramic body 10 (that is, the distance between the first and second side surfaces S5 and S6) is shorter than or equal to the length L of the ceramic body 10 may be called a reverse geometry capacitor (RGC) or a low inductance chip capacitor (LICC).

The insulating substrate 110 may be configured of insulating layers, and may include a conductive pattern 120 and conductive via holes 140 that configure interlayer circuits in various forms as shown in FIG. 6 if necessary. The insulating substrate 110 may be the printed circuit board 200 including the multilayer ceramic electronic component 100 disposed therein.

In addition, according to an exemplary embodiment of the present disclosure, the first and second external electrodes 31 and 32 are formed such that the maximum width (BWmax) and the minimum width (BWmin) of at least one of the first and second external electrodes 31 and 32 formed on the first main surface S1 satisfy 0≤BWmax−BWmin≤100 μm, such that each of the first and second external electrodes 31 and 32 may be connected to three or more conductive via holes.

Therefore, unlike the related art, a plurality of vias may be connected to each other, such that a current pass may be decreased to decrease an ESL.

After the multilayer ceramic electronic component 100 is inserted into the printed circuit board 200, it may be subjected to several severe environments when a post-process such as a heat treating process, and the like, is performed on the printed circuit board 200.

Particularly, in the heat treating process, contraction and expansion of the printed circuit board 200 may be directly transferred to the multilayer ceramic electronic component inserted into the printed circuit board 200 to apply stress to an adhesion surface between the multilayer ceramic electronic component and the printed circuit board 200.

In the case in which the stress applied to the adhesion surface between the multilayer ceramic electronic component and the printed circuit board 200 is higher than adhesion strength therebetween, a delamination defect that the adhesion surface is delaminated may occur.

The adhesion strength between the multilayer ceramic electronic component and the printed circuit board 200 may be in proportion to electrochemical coupling force between the multilayer ceramic electronic component and the printed circuit board 200 and an effective surface area of the adhesion surface between the multilayer ceramic electronic component and the printed circuit board 200. Therefore, the surface roughness of the multilayer ceramic electronic component is controlled in order to improve the effective surface area of the adhesion surface between the multilayer ceramic electronic component and the printed circuit board 200, whereby the delamination phenomenon between the multilayer ceramic electronic component 100 and the printed circuit board 200 may be decreased. In addition, an occurrence frequency of the delamination on the adhesion surface between the multilayer ceramic electronic component 100 and the printed circuit board 200 depending on the surface roughness of the multilayer ceramic electronic component 100 to be embedded in the printed circuit board 200 may be confirmed.

Hereafter, although the present disclosure will be described in detail with reference to Examples, it is not limited thereto.

In order to confirm whether or not a defect occurred at the time of processing vias depending on a difference (BWmax−BWmin) between a maximum width (BWmax) and a minimum width (BWmin) of at least one of first and second external electrodes formed on a first main surface of a ceramic body of a multilayer ceramic electronic component to be embedded in a board according to the embodiment of the present disclosure, whether or not a defect occurred at the time of processing vias depending on thicknesses of first and second metal layers 31b and 32b, and an occurrence frequency of delamination on an adhesion surface depending on surface roughnesses of the first and second metal layers 31b and 32b, after a board having a multilayer ceramic electronic component embedded therein was left at a temperature of 85° C. and a relative humidity of 85%, which are general conditions of a chip component for a mobile phone mother board, for thirty minutes, the respective experiments were performed while changing the width of each of the first and second external electrodes and the thickness and the surface roughness of each of the first and second metal layers 31b and 32b.

The following Table 1 shows whether or not a contact defect between the multilayer ceramic capacitor and the vias formed in the board occurred depending on the difference (BWmax−BWmin) between the maximum width (BWmax) and the minimum width (BWmin) of at least one of the first and second external electrodes formed on the first main surface of the ceramic body.

TABLE 1

| Sample | BWmax − BWmin | Processing defect rate (%) | Maximum number of vias capable of being processed in external electrodes formed on first main surface |
|---|---|---|---|
| 1 | 0 | 0 | 5 |
| 2 | 10 | 0 | 5 |
| 3 | 20 | 0 | 4 |
| 4 | 30 | 0 | 3 |
| 5 | 40 | 0 | 2 |
| 6 | 50 | 0 | 2 |
| 7 | 60 | 0 | 2 |
| 8 | 70 | 0 | 1 |
| 9 | 80 | 0 | 1 |
| 10 | 90 | 0 | 1 |
| 11 | 100 | 0 | 1 |
| *12 | 110 | 0.8 | 1 |
| *13 | 120 | 2.0 | 1 |
| *14 | 130 | 5.0 | 1 |
| *15 | 140 | 7.0 | 1 |

*Comparative Example

Referring to the above Table 1, it may be appreciated that a defect did not occurred at the time of processing the vias in the case in which the difference (BWmax−BWmin) between the maximum width (BWmax) and the minimum width (BWmin) of at least one of the first and second external electrodes formed on the first main surface of the ceramic body was 100 μm or less.

On the other hand, it may be appreciated that a defect occurred at the time of processing the vias in the case in which the difference (BWmax−BWmin) between the maximum width (BWmax) and the minimum width (BWmin) of at least one of the first and second external electrodes formed on the first main surface of the ceramic body exceeded 100 μm.

The following Table 2 shows via processing defect rates according to Inventive Examples and Comparative Example depending on the number of vias processed in at least one of the first and second external electrodes formed on the first main surface of the ceramic body.

TABLE 2

| The number of processed vias | Via processing defect rate according to Comparative Example (%) | Via processing defect rate according to Inventive Example (%) |
|---|---|---|
| 1 | 0 | 0 |
| 2 | 0 | 0 |
| 3 | 1.0 | 0 |
| 4 | 3.7 | 0.3 |
| 5 | 8.4 | 0.7 |

Referring to the above Table 2, it may be appreciated that in the case in which the number of vias processed in at least one of the first and second external electrodes formed on the first main surface of the ceramic body was three or more, Comparative Examples had a via processing defect rate of 1.0% or more, which was defective; however, Inventive Examples had a via processing defect rate less than 1.0%, which was not defective.

The following Table 3 shows whether or not a defect occurred at the time of processing the vias depending on the thickness of each of the first and second metal layers 31b and 32b.

TABLE 3

| Thickness of metal layer (μm) | Decision |
|---|---|
| Less than 1 | X |
| 1 to 2 | X |
| 2 to 3 | X |
| 3 to 4 | Δ |
| 4 to 5 | ○ |
| 5 to 6 | ⊚ |
| 6 or more | ⊚ |

X: defective rate of 10% or more
Δ: defective rate of 1 to 10%
○: defective rate of 0.01 to 1%
⊚: defective rate less than 0.01

Referring to the above Table 3, it may be appreciated that in the case in which the thickness of each of the metal layers 31b and 32b was 5 μm or more, a multilayer ceramic capacitor allowing for excellent processing of the vias in the board and having excellent reliability could be implemented.

On the other hand, it may be appreciated that in the case in which the thickness of each of the metal layers 31b and 32b was less than 5 μm, a detect occurred at the time of processing the vias in the board.

The following Table 4 shows an occurrence frequency of delamination on the adhesion surface depending on the surface roughness of each of the first and second metal layers 31b and 32b.

TABLE 4

| Surface roughness of metal layer (nm) | Decision |
|---|---|
| Less than 50 | X |
| 50 to 100 | X |
| 100 to 150 | Δ |
| 150 to 200 | ○ |
| 200 to 250 | ⊚ |
| 250 or more | ⊚ |

X: defective rate of 5% or more
Δ: defective rate of 1 to 5%
○: defective rate of 0.01 to 1%
⊚: defective rate less than 0.01

Referring to the above Table 4, it may be appreciated that in the case in which the surface roughness of each of the first and second metal layers 31b and 32b was 200 nm or more, the occurrence frequency of delamination on the adhesion surface is low, such that a multilayer ceramic capacitor having excellent reliability could be implemented.

On the other hand, it may be appreciated that in the case in which the surface roughness of each of the first and second metal layers 31b and 32b was less than 200 nm, the occurrence frequency of delamination on the adhesion surface was increased, such that reliability was decreased.

As set forth above, the multilayer ceramic electronic component according to the exemplary embodiment of the present disclosure may implement low inductance, such that electrical performance thereof may be improved.

In addition, according to the exemplary embodiment of the present disclosure, a deviation in widths of the external electrodes may be decreased, whereby a defect occurring at the time of processing vias for electrical connection with a package substrate circuit may be solved. Further, since a plurality of vias may be connected to each other, a current path may be decreased, whereby an equivalent series inductance (ESL) may be decreased.

Further, according to the exemplary embodiment of the present disclosure, surface roughness of the metal layer may be adjusted, whereby adhesion characteristics capable of decreasing a delamination phenomenon between the multilayer ceramic electronic component and the board may be improved.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component to be embedded in a board comprising:
    a ceramic body including dielectric layers, having first and second main surfaces facing each other, first and second side surfaces facing each other, and first and second end surfaces facing each other;
    first and second internal electrodes disposed to face each other, having the dielectric layers interposed therebetween, and alternately exposed to the first side surface or the second side surface; and
    first and second external electrodes formed on the first and second side surfaces of the ceramic body, respectively, and electrically connected to the first and second internal electrodes, respectively,
    wherein the first external electrode includes a first electrode layer and a first metal layer formed on the first electrode layer, the second external electrode includes a second electrode layer and a second metal layer formed on the second electrode layer, the first and second external electrodes are formed to be extended to the first main surface of the ceramic body, and when a maximum width and a minimum width of at least one of the first and second external electrodes formed on the first main surface are defined as BWmax and BWmin, respectively, $0 \leq BWmax - BWmin \leq 100$ μm is satisfied,
    wherein when a thickness of the ceramic body is a distance between the first and second main surfaces, a width of the ceramic body is a distance between the first side surface on which the first external electrode is formed and the second side surface on which the second external electrode is formed, and a length of the ceramic body is a distance between the first and second end surfaces, the width of the ceramic body is shorter than or equal to the length of the ceramic body, and
    wherein when a thickness of each of the first and second metal layers is defined as tp, $tp \geq 5$ μm is satisfied.

2. The multilayer ceramic electronic component of claim 1, wherein the first and second electrode layers include a copper (Cu) and a glass frit, and the first and second metal layers are a plated layer including a copper (Cu).

3. The multilayer ceramic electronic component of claim 1, wherein widths of the first and second external electrodes formed on the first main surface are larger than those of the first and second external electrodes formed on the second main surface.

4. The multilayer ceramic electronic component of claim 1, wherein when the length and the width of the ceramic body are defined as L and W, respectively, $0.5L \leq W \leq L$ is satisfied.

5. The multilayer ceramic electronic component of claim 1, wherein when surface roughness of each of the first and second metal layers is defined as Ra, $200 \text{ nm} \leq Ra \leq tp$ is satisfied.

6. The multilayer ceramic electronic component of claim 1, wherein the first and second metal layers include copper (Cu).

7. The multilayer ceramic electronic component of claim 1, wherein the ceramic body has a thickness of 100 μm or less.

* * * * *